United States Patent
Yamauchi et al.

(10) Patent No.: US 9,100,020 B2
(45) Date of Patent: Aug. 4, 2015

(54) PANEL DEVICE

(75) Inventors: Kazuto Yamauchi, Okazaki (JP);
Yasunori Murayama, Ichinomiya (JP);
Sadahiko Tanaka, Okazaki (JP);
Keitaro Takizawa, Okazaki (JP);
Kouichi Yamanoue, Yokohama (JP)

(73) Assignees: Mitsubishi Jidosha Kogyo Kabushiki Kaisha, Tokyo (JP); Visteon Japan, Ltd., Yokohama-shi, Kanagawa (JP)

( * ) Notice: Subject to any disclaimer, the term of this patent is extended or adjusted under 35 U.S.C. 154(b) by 471 days.

(21) Appl. No.: 12/878,087

(22) Filed: Sep. 9, 2010

(65) Prior Publication Data

US 2010/0330371 A1    Dec. 30, 2010

Related U.S. Application Data

(63) Continuation of application No. PCT/JP2008/073634, filed on Dec. 25, 2008.

(30) Foreign Application Priority Data

Mar. 31, 2008    (JP) ................................. 2008-094388

(51) Int. Cl.
*H03K 17/96*    (2006.01)

(52) U.S. Cl.
CPC ........ *H03K 17/962* (2013.01); *H01H 2239/006* (2013.01); *H03K 2217/960755* (2013.01)

(58) Field of Classification Search
CPC ................ H03K 17/962; H03K 2217/960755; H01H 2239/006
USPC .................. 428/131, 411.1; 200/600
See application file for complete search history.

(56) References Cited

U.S. PATENT DOCUMENTS

| | | | |
|---|---|---|---|
| 3,790,645 A * | 2/1974 | Murayama et al. ............ 525/276 |
| 4,775,573 A * | 10/1988 | Turek ............................. 428/209 |
| 5,236,573 A * | 8/1993 | Shannon ........................ 205/122 |
| 5,358,579 A | 10/1994 | Tanabe | |
| 5,565,658 A * | 10/1996 | Gerpheide et al. .......... 178/18.02 |
| 6,205,690 B1 * | 3/2001 | Heropoulos et al. ............ 40/442 |
| 6,459,588 B1 * | 10/2002 | Morizumi et al. ............. 361/737 |
| 7,242,393 B2 * | 7/2007 | Caldwell ........................ 345/173 |
| 7,279,268 B2 * | 10/2007 | Shia et al. ...................... 430/314 |
| 8,148,659 B2 * | 4/2012 | Yamauchi et al. ............. 200/600 |
| 2001/0018809 A1 | 9/2001 | Heropoulos et al. | |

(Continued)

FOREIGN PATENT DOCUMENTS

| | | |
|---|---|---|
| CN | 101248411 A | 8/2008 |
| JP | 4-181618 A | 6/1992 |

(Continued)

OTHER PUBLICATIONS

Russian Office Action issued in Russian Patent Application No. 2010140066/07(057301) on Dec. 9, 2011.

(Continued)

*Primary Examiner* — Callie Shosho
*Assistant Examiner* — John Freeman
(74) *Attorney, Agent, or Firm* — Birch, Stewart, Kolasch & Birch, LLP

(57) ABSTRACT

A panel device includes a panel section, a first conductive layer that is provided in a side of one surface of the panel section, an insulating layer that is stacked on the first conductive layer and a second conductive layer that is stacked on the insulating layer. The first conductive layer and the second conductive layer are formed by coating an electrically conductive solvent-type substance. The insulating layer is formed by coating an insulating curing-acceleration-type substance.

3 Claims, 3 Drawing Sheets

(56) References Cited

U.S. PATENT DOCUMENTS

2001/0046081 A1* 11/2001 Hayashi et al. ............... 359/296
2004/0238726 A1* 12/2004 Caldwell ....................... 250/221
2008/0142352 A1* 6/2008 Wright .......................... 200/600

FOREIGN PATENT DOCUMENTS

| JP | 5-217454 A | 8/1993 |
| JP | 2000-086871 A | 3/2000 |
| JP | 2005-38809 A | 2/2005 |
| WO | WO 01/95358 A2 | 12/2001 |

OTHER PUBLICATIONS

Chinese Office Action issued in Chinese Patent Application No. 200880118557.8 on Jun. 27, 2012.

* cited by examiner

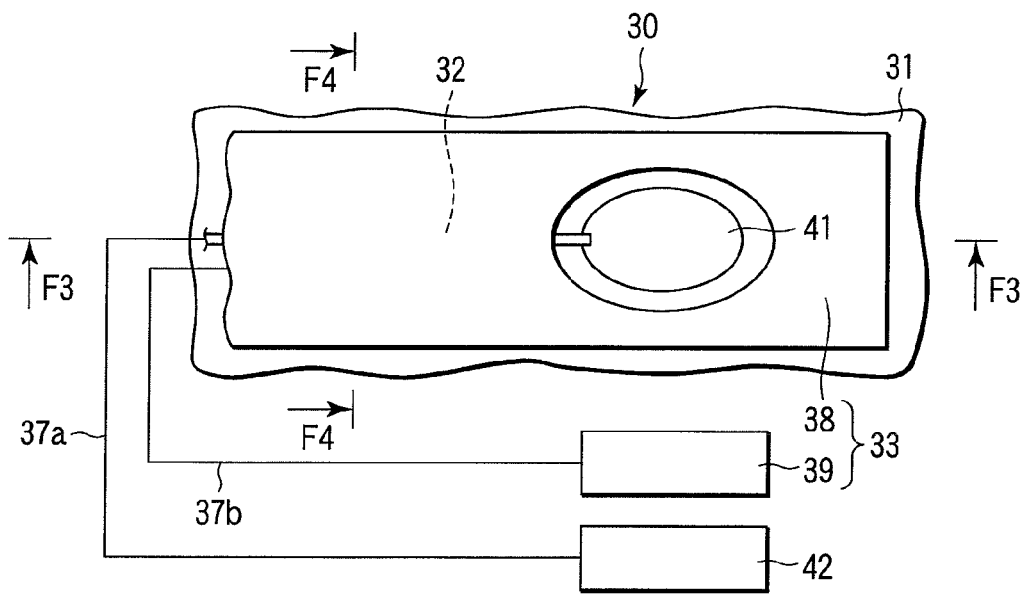
F I G. 2
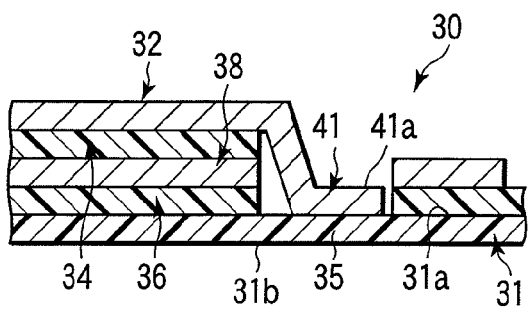
F I G. 3
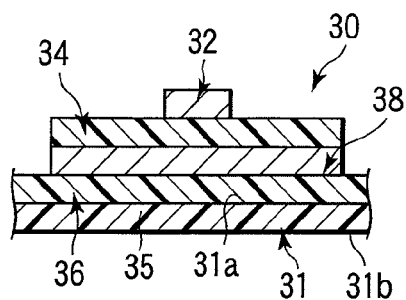
F I G. 4

PANEL DEVICE

CROSS REFERENCE TO RELATED APPLICATIONS

This is a Continuation application of PCT Application No. PCT/JP2008/073634, filed Dec. 25, 2008, which was published under PCT Article 21 (2) in Japanese.

This application is based upon and claims the benefit of priority from prior Japanese Patent Application No. 2008-094388, filed Mar. 31, 2008, the entire contents of which are incorporated herein by reference.

BACKGROUND OF THE INVENTION

1. Field of the Invention

The present invention relates to a panel device including an input section used for operational input to, for example, an electronic device.

2. Description of the Related Art

Conventionally, in order to allow operation of, for example, an audio device mounted in a car, a switch panel device is installed at a position on the instrument panel where easy operation is available for the driver or passenger. Several switch panel devices are provided with electrostatic capacitive sensors. In a switch panel device of this type, the electrostatic capacitance of an electrostatic capacitive sensor changes when an operator touches a panel section of the switch panel device. By sensing the change, the operation to be carried out is detected.

A connection pattern is formed in the panel section of a switch panel device using such an electrostatic capacitive sensor. The connection pattern electrically connects a detection electrode formed in the panel section to a sensing circuit formed outside the panel section. Therefore, a shield electrode is provided around the connection pattern on the panel section of the panel switch device in order to prevent the electrostatic capacitive sensor from making erroneous detection.

Also in the panel section, an insulating layer is formed between the connection pattern and the shield electrode, in order to prevent the connection pattern and the shield electrode from being electrically connected to each other.

There has been a proposal for use of an insulating sheet member such as resin and the like provided independently from the panel section to form the insulating layer. In this case, the sheet member forming the insulating layer is fixed stacked on the panel section. However, a structure of using the insulating sheet member necessitates an increased number of components and accordingly increases costs. Further, a work process of fixing the sheet member stacked on panel section is required so that costs increases further.

There hence has been also a proposal for forming such an insulating layer by printing. This technique is disclosed in Jpn. Pat. Appln. KOKAI Publication No. 5-217454.

Meanwhile, there has been also a proposal for forming a connection pattern and a shield electrode by printing an electrically conductive ink on a panel section. However, if a connection pattern and a shield electrode are formed, for example, by printing with use of an electrically conductive ink of a solvent type, a solvent in the connection pattern and the shield electrode positioned in two sides of an insulating layer dissolves the insulating layer, and components such as electrically conductive filler and the like in the connection pattern and the shield electrode enter into the insulating layer.

Since components such as electrically conductive filler in the connection pattern and the shield electrode enters into the insulating layer, insulation of the insulating layer deteriorates. As a result, the connection pattern and the shield electrode are electrically connected to each other through the insulating layer. However, it is undesirable that the connection pattern and the shield electrode are electrically connected to each other.

SUMMARY OF THE INVENTION

The present invention has an object of providing a panel device capable of layering plural conductive members with reduced costs.

According to an aspect of the invention, a panel device including a panel section, a first conductive layer that is provided in a side of one surface of the panel section and has a electric conductivity, an insulating layer that is stacked on the first conductive layer and a second conductive layer that is stacked on the insulating layer and has a property of conducting electricity. The first conductive layer and the second conductive layer are formed by coating an electrically conductive solvent-type substance. The insulating layer is formed by coating an insulating curing-acceleration-type substance.

According to this configuration, even if an insulating layer to insulate the first conductive layer having a property of conducting electricity and the second conductive layer having a property of conducting electricity from each other is formed between both of these layers, the solvent-type substance forming the first and second conductive layers and the curing-acceleration-type substance forming the insulating layer are different materials, and are therefore restricted from dissolving each other. Accordingly, the first and second conductive layers are restricted from being electrically connected to each other through the insulating layer.

According to another aspect of the invention, there is provided a panel device including a panel section, a first conductive layer that is provided in a side of one surface of the panel section and has a property of conducting electricity, an insulating layer that is stacked on the first conductive layer and a second conductive layer that is stacked on the insulating layer and has a property of conducting electricity. The first conductive layer is formed by coating an electrically conductive curing-acceleration-type substance. The second conductive layer is formed by coating an electrically conductive solvent-type substance. The insulating layer is formed by coating an insulating solvent-type substance.

According to this configuration, even if an insulating layer to insulate the first conductive layer having a property of conducting electricity and the second conductive layer having a property of conducting electricity from each other is formed between both of these layers, the curing-acceleration-type substance forming the first conductive layer and the solvent-type substance forming the insulating layer are different materials, and are therefore restricted from dissolving each other. Accordingly, the first and second conductive layers are restricted from being electrically connected to each other through the insulating layer.

According to still another aspect of the invention, there is provided a panel device including a panel section, a first conductive layer that is provided in a side of one surface of the panel section and has a property of conducting electricity, an insulating layer that is stacked on the first conductive layer and a second conductive layer that is stacked on the insulating layer and has a property of conducting electricity. The first conductive layer and the second conductive layer are formed by coating an electrically conductive curing-acceleration-type substance. The insulating layer is formed by coating an insulating solvent-type substance.

According to this configuration, even if an insulating layer to insulate the first conductive layer having a property of conducting electricity and the second conductive layer having a property of conducting electricity from each other is formed between both of these two layers, the curing-acceleration-type substance forming the first and second conductive layers and the solvent-type substance forming the insulating layer are different materials, and are therefore restricted from dissolving each other. Accordingly, the first and second conductive layers are restricted from being electrically connected to each other through the insulating layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 2 is an enlarged plan view illustrating an area F2 surrounded by a two-dot chain line in FIG. 1;

FIG. 3 is a cross-sectional view of a panel body illustrated along a line F3-F3 denoted in FIG. 2;

FIG. 4 is a cross-sectional view of the panel body illustrated along a line F4-F4 denoted in FIG. 2;

DETAILED DESCRIPTION OF THE INVENTION

A panel device according to the first embodiment of the present invention will now be described with reference to FIGS. 1 to 8. The present embodiment will be described referring to a switch panel device 10 as an example of a panel device. The switch panel device 10 is used, for example, when input operation is performed on an audio device mounted on a car. However, what is referred to as a panel device in the present invention is not limited to the switch panel device 10.

Figure 1:
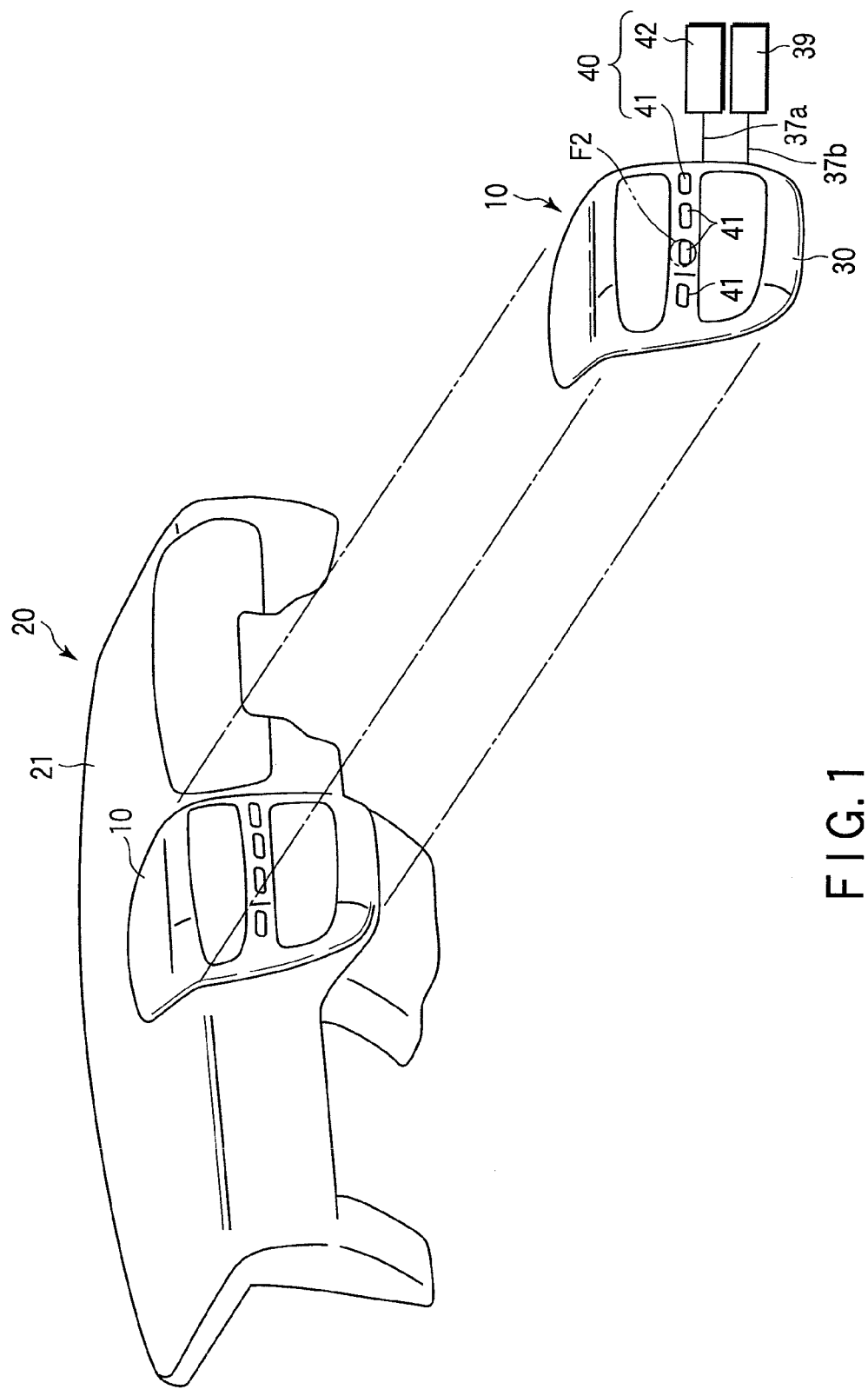
FIG. 1 is a perspective view illustrating an instrumental panel in which a panel device according to the first embodiment of the present invention is built.

FIG. 1 illustrates an instrument panel 20 in which the switch panel device 10 is built. FIG. 1 also illustrates a state where the switch panel device 10 is disassembled. The instrument panel 20 is constructed by integrally forming the switch panel device 10 and an instrument panel body 21 (which is a part of the instrument panel 20 other than the instrument panel 20) by insert-injection.

The switch panel device 10 includes a panel body 30 and a switch 40. The panel body 30 defines an exterior shape of the switch panel device 10. The panel body 30 will be described in details later.

The switch 40 is of an electrostatic capacitive sensor type and includes a touch sensing electrode 41 and a sensing circuit 42. The touch sensing electrode 41 and the sensing circuit 42 are electrically connected to each other. As illustrated in FIG. 1, the touch sensing electrode 41 is an electrode which a user touches when carrying out an operation. Plural touch sensing electrodes 41 are formed on the panel body 30.

When an operator touches a touch sensing electrode 41, electrostatic capacitance of a sensor then changes. The sensing circuit 42 detects the change in electrostatic capacitance and thereby senses an operator's touch on the touch sensing electrode 41. The sensing circuit 42 is connected to a control device not illustrated, and the control device controls the audio device, based on a detection result from the sensing circuit 42.

FIG. 2 is a plan view illustrating an area F2 enlarged, which is surrounded by a two-dot chain line in FIG. 1. FIG. 2 illustrates the switch panel device 10 (panel body 30) viewed from outside, and illustrates only a vicinity of one of the plural touch sensing electrodes 41 formed on the switch panel device 10.

The switches 40 may all have the same structure as each other, and vicinities of respective ones of the plural touch sensing electrodes 41 may all have the same structure as each other, too. Therefore, the structures of the switches 40 and the structure of the switch panel device 10 will be described referring to a structure of the vicinity of only one touch sensing electrode 41 as illustrated in FIG. 2.

FIG. 3 is a cross-sectional view of the panel body 30 illustrated along a line F3-F3 in FIG. 2. FIG. 3 is a cross-sectional view of the vicinity of one touch sensing electrode 41 in the panel body 30. FIG. 4 illustrates a cross-section of a part of the panel body 30 where there is no touch sensing electrode 41.

The panel body 30 includes a panel section 31, a design layer 36, a connection pattern 32, a shield section 33, and an insulating layer 34.

The panel sec Lion 31 defines an exterior shape of the switch panel device 10 (panel body 30). The panel section 31 is made of a resin sheet 35. The resin sheet 35 is formed of, for example, transparent resins.

As illustrated in FIG. 3, the touch sensing electrode 41 is provided on one surface 31a of the panel section 31. An operator touches the touch sensing electrode 41 through the panel section 31 (i.e., from above the panel section 31). The operator touches the touch sensing electrode 41 from a side of the other surface 31b opposite to the surface 31a. The surface 31b is exposed to the car passenger compartment.

As illustrated in FIGS. 3 and 4, the design layer 36 is stacked on the surface 31a of the panel section 31, and defines colors and decorative patterns of the panel body 30. Colors, decorative patterns and the like of the panel body 30 are recognized by seeing the design layer 36 through the panel section 31.

As illustrated in FIG. 3, the design layer 36 is not stacked on a vicinity area of a touch sensing electrode 41 including the touch sensing electrode 41. As illustrated in FIG. 4, the design layer 36 is stacked on the touch sensing electrode and on an area where the touch sensing electrode 41 do not exist.

The connection pattern 32 is formed in a side of the surface 31a of the panel section 31. The connection pattern 32 is provided to electrically connect the touch sensing electrode 41 to the sensing circuit 42. The connection pattern 32 has a property of conducting electricity.

In the present invention, the side of the surface 31a is intended to mean a side where the surface 31a exists. Therefore, to be provided in the side of the surface 31a is a concept including a case of being provided on the side of the surface 31a, being provided on the surface 31a and not being provided on the surface 31a but being provided in the side where the surface 31a exists in relation to the panel section 31 as a boundary. Therefore, in actual, the connection pattern 32 which is provided on an insulating layer 34 described later is not formed on the surface 31a but is formed in the side of the surface 31a.

As illustrated in FIG. 1, the sensing circuit 42 is located outside the panel body 30. Therefore, the connection pattern 32 extends to an edge of the panel section 31 and is electrically connected to a first wiring 37a. The first wiring 37a and the sensing circuit 42 are electrically connected to each other. The touch sensing electrode 41 is electrically connected to the sensing circuit 42 through the connection pattern 32 and the first wiring 37a.

As illustrated in FIGS. 2 to 4, the shield section 33 is provided to prevent erroneous operation of the switch 40. The shield section 33 includes a shield electrode 38 and a shield signal generation circuit 39. The shield electrode 38 is positioned between the connection pattern 32 and the design layer 36, and is stacked on the design layer 36. The shield electrode 38 has an area which covers the connection pattern 32. The shield electrode 38 has a property of conducting electricity.

In order to prevent electrostatic capacitance of the switch 40 from changing when an operator touches the connection pattern 32 from the side of the panel section 31 through the panel section 31 (from above the panel section 31), the shield electrode 38 is applied with a voltage having the same potential and phase as the touch sensing electrode 41.

Therefore, in an area where the connection pattern 32 is formed above the panel section 31, the shield electrode 38 is formed, and the connection pattern 32 and the shield electrode 38 are arranged opposed to each other.

As illustrated in FIG. 3, the shield electrode 38 is neither formed on the touch sensing electrode 41 nor in the vicinity of the touch sensing electrode 41. Therefore, the shield electrode 38 and the touch sensing electrode 41 are not electrically connected to each other.

As illustrated in FIG. 1, the shield signal generation circuit 39 is located outside the panel body 30. The shield signal generation circuit 39 is applied with a voltage having the same potential and phase as the touch sensing electrode 41, as described above.

The shield electrode 38 extends to, for example, an edge of the panel section 31 and is electrically connected to a second wiring 37b. The second wiring 37b is electrically connected to the shield signal generation circuit 39. The shield electrode 38 is electrically connected to the shield signal generation circuit 39 through the second wiring 37b.

As illustrated in FIGS. 3 and 4, the insulating layer 34 is provided between the connection pattern 32 and the shield electrode 38. Specifically, the insulating layer 34 is stacked on the shield electrode 38, and the connection pattern 32 is stacked on the insulating layer 34.

The insulating layer 34 is formed in a manner that the shield electrode 38 and a layer of the connection pattern 32 are insulated from each other (not electrically connected to each other). The insulating layer 34 is desirably 5 MΩ or more. The insulating layer 34 is neither formed on the touch sensing electrode 41 nor in the vicinity of the touch sensing electrode 41.

In the panel body 30 formed as described above, the design layer 36 is stacked on the one surface 31a of the panel section 31, and the touch sensing electrode 41 is formed as well. The shield electrode 38 is stacked on the design layer 36. The insulating layer 34 is stacked on the shield electrode 38. The connection pattern 32 is stacked on the insulating layer 34.

In the descriptions above, one touch sensing electrode 41 has been cited to describe the switch 40. In a similar manner, a shield electrode 38, an insulating layer 34, and a connection pattern 32 are formed between each of the other touch sensing electrodes 41 and the sensing circuit 42.

Next, an example of a procedure of forming the panel body 30 will be described. At first, a design layer 36, a touch sensing electrode 41, a shield electrode 38, an insulating layer 34, and a connection pattern 32 are formed on a resin sheet 35 like a flat plate by screen-printing various inks. The resin sheet 35 is plate-like in the state where various inks are being printed. In this respect, a specific description will now be made.

Figure 5:
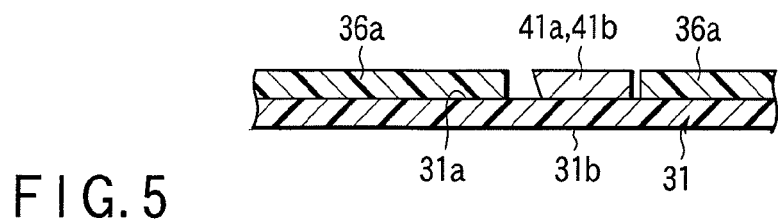
FIG. 5 is a cross-sectional view illustrating fixture in which a design layer and a touch sensing electrode are formed in the panel body according to the first to third embodiments of the invention.

At first, as illustrated in FIG. 5, screen printing is performed on one surface of the resin sheet 35 (the one surface 31a of the panel section 31) with use of an ink 36a, thereby to form a design layer 36. The ink 36a used to form the design layer 36 is liquid and contains a pigment. After printing the design layer 36, the in 36a is sufficiently dried at a sufficient temperature for sufficient time.

Subsequently, a touch sensing electrode 41 is formed on the one surface of the resin sheet 35 by screen printing. An ink 41a used to form the touch sensing electrode 41 is liquid and has a property of conducting electricity, e.g., contains electrically conductive filler and the like. After printing the touch sensing electrode 41, the ink 41a is sufficiently dried at a sufficient temperature for sufficient time. The ink to form the touch sensing electrode 41 need only have a property of conducting electricity.

Alternatively, the touch sensing electrode 41 may be formed first. After printing the design layer 36 and the touch sensing electrode 41, the inks 36a and 41a may simultaneously be dried sufficiently.

Figure 6:
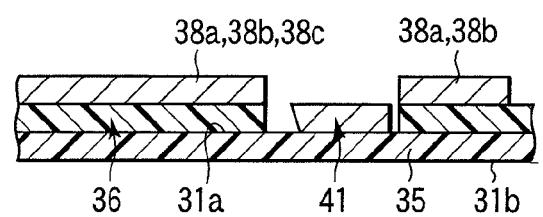
FIG. 6 is a cross-sectional view illustrating a step in which a shield electrode is formed on the design layer according to the first to third embodiments of the invention.

Subsequently, as illustrated in FIG. 6, a shield electrode 38 is formed (stacked) on the design layer 36 by screen printing with use of an ink 38a. The ink 38a which is of a solvent type is used for the shield electrode 38.

The ink 38a is liquid, contains electrically conductive filler and the like, and accordingly has a property of conducting electricity. The ink 38a used to form the shield electrode 38 is of a solvent type and need only have a property of conducting electricity. After printing the shield electrode 38, the ink 38a is sufficiently dried at a sufficient temperature for sufficient time.

What is referred to as a solvent-type substance in the present invention is substance containing alcohol, toluene or the like as a solvent.

The shield electrode 38 is an example of what is referred to as a first conductive layer in the invention. The ink 38a is an example of what is referred to as a solvent-type substance in the invention. A vehicle contained in the ink 38a is an organic solvent (for example, alcohol, toluene or the like as described above). Therefore, the ink 38a is solvent type. Screen printing is an example of what is referred to as a coating in the invention. The ink 38a may be coated in a different method. The solvent-type substance is not limited to the ink 38a. In brief, the solvent-type substance need only have a property of conducting electricity, be of a solvent type, and be coatable.

Figure 7:
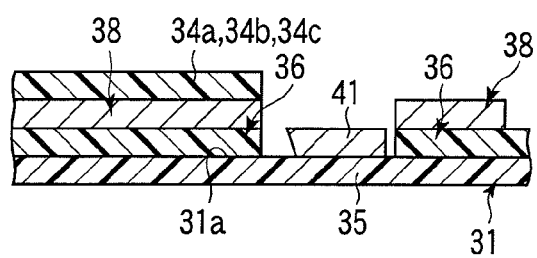
FIG. 7 is a cross-sectional view illustrating a step in which an insulating layer is printed on the shield electrode according to the first to third embodiments of the invention.

Subsequently, as illustrated in FIG. 7, an insulating layer 34 is formed on the shield electrode 38 by screen printing with use of an ink 34a. The ink 34a used to form the insulating layer 34 is liquid, is of a type capable of accelerating curing, and is insulating.

In the present embodiment, an insulating ink of an ultraviolet curing agent type is used as an ink of the type capable of accelerating curing. An ink of the ultraviolet curing agent type accelerates curing when irradiated with ultraviolet rays. After the insulating layer 34 is printed, the ink 34a is sufficiently dried by sufficiently irradiating ultraviolet rays.

Substance of the type capable of accelerating curing is not limited to an ink of the ultraviolet curing agent type. Another example may be an ink of a two-liquid reaction type. A two-liquid-reaction-type ink uses reactive resin as an ink binder and is mixed with liquid substance as a curing agent immediately after printing. This ink is cured and dried by causing chemical reaction after printing.

What is referred to as an ink capable of accelerating curing in the present embodiment is insulating and does not use an organic solvent as a vehicle in the ink but can accelerate curing/drying by chemical reaction and the like after printing.

What is referred to as a curing-acceleration-type substance in the present invention is substance which does not use an organic solvent and can accelerate curing/drying owing to chemical reaction after coating. An example thereof is an ultraviolet-curing-agent-type ink. This ultraviolet-curing-agent-type ink is widely used as a quick-drying ink. The ultraviolet-curing-agent-type ink can reduce volatile organic compounds (VOCs) by not using an organic solvent, and can reduce costs by omitting drying steps.

The ink 34a is an example of what is referred to as a curing-acceleration-type substance in the invention. The screen printing is an example of what is referred to as a coating in the invention. The ink 34a may be coated in a different method. The curing-acceleration-type substance is not limited to the ink 34a. In brief, the curing-acceleration-type substance need only be insulating, be of the curing acceleration type, and be coatable.

Figure 8:
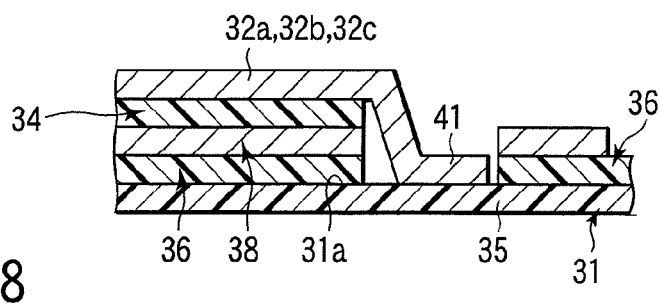
FIG. 8 is a cross-sectional view illustrating a step in which a connection pattern is printed on the insulating layer according to the first to third embodiments of the invention.

Subsequently, as illustrated in FIG. 8, a connection pattern 32 is formed on the insulating layer 34 by screen printing with use of an ink 32a. After printing the connection pattern 32, for example, the ink 32a is used to electrically connect the connection pattern 32 and the touch sensing electrode 41.

The connection pattern 32 and the touch sensing electrode may be electrically connected to each other either by printing or by any other means.

A solvent-type ink 32a is used as the ink 32a used to form the connection pattern 32. This ink 32a is liquid, contains electrically conductive filler and the like, and has a property of conducting electricity. The ink 32a used for the connection pattern 32 need only be of a solvent type and have a property of conducting electricity. After the connection pattern 32 is printed, the ink 32a is sufficiently dried at a sufficient temperature for sufficient time.

The connection pattern 32 is an example of what is referred to as a second conductive layer in the present invention. The ink 32a is an example of what is referred to as a solvent-type substance in the present invention. The vehicle contained in the ink 32a is an organic solvent. Therefore, the ink 32a is of a solvent type. The screen printing is an example of what is referred to as a coating in the present invention. The ink 32a may alternatively be coated in a different method. The solvent-type substance is not limited to the ink 32a. In brief, the solvent-type substance need only have a property of conducting electricity, be of a solvent type, and be coatable.

As described above, after each of printing steps (for the design layer 36, touch sensing electrode 41, shield electrode 38, insulating layer 34, and connection pattern 32), an ink which has been printed immediately before is sufficiently dried before next printing is performed. Being sufficiently dried as worded herein implies drying to an extent that a layer to be printed and stacked on a previously printed layer is not mixed with the previously printed layer.

For example, the ink 38a is sufficiently dried after the shield electrode 38 is formed by printing. Therefore, when the insulating layer 34 is printed next, the ink 38a forming the shield electrode 38 is not mixed with the ink 34a to form the insulating layer 34. The same as described here applies to any layers neighboring each other.

Adopted as an example of means for sufficient drying is to stand for sufficient time at a sufficient temperature and to irradiate sufficient ultraviolet rays although the means is not limited thereto. In brief, printed layers need only to be dried sufficiently.

Subsequently, after all printing (of the design layer 36, touch sensing electrode 41, shield electrode 38, insulating layer 34, and connection pattern 32) is completed, the panel body 30 still has a plate-like shape, which is then subjected to shape-forming by vacuum compressed-air molding into a product shape. Specifically, interior of a metal mold is made vacuum, and a plate-like panel body 30 set in the mold is heated and pressed, thereby to mold the panel body 30 into the shape of the metal mold. In this manner, the panel body 30 is formed into a product shape.

Therefore, inks (inks 36a, 41a, 38a, 34a, and 32a) used in the various printing steps are preferably able to spread excellently so as to stand for shape-forming.

After being subjecting to shape-forming, the panel body 30 is formed integrally with the instrument panel 21 by insert injection.

After the panel body 30 is formed integrally with the instrument panel 21, the connection pattern 32 and the first wiring 37a are electrically connected, and the shield electrode 38 is electrically connected to the second wiring 37b.

In the switch panel device 10 constructed as described above, the ink 34a used for the insulating layer 34 is of a type capable of accelerating curing, and the inks 38a and 32a used for the shield electrode 38 and the connection pattern 32 located in two sides of the insulating layer 34 sandwiched in between are of a solvent type.

Therefore, inks (inks 38a and 34a) forming the shield electrode 38 and the insulating layer 34 neighboring each other, as well as inks (inks 34a and 32a) forming the insulating layer 34 and the connection pattern 32, are respectively of different types which prevent the inks from melting into each other.

Specifically, the inks 32a and 38a of a solvent type are heated after printing, and solvents are vaporized to cure. The ink 34a as a curing-acceleration-type ink is irradiated with ultraviolet rays immediately after printing, and cures fast. Therefore, the ink 34a is prevented from being mixed with a dried pattern.

As a result, component having a property of conducting electricity, such as electrically conductive filler and the like in the shield electrode 38, is restricted from entering into the insulating layer 34, and component also having a property of conducting electricity, such as electrically conductive filler and the like in the connection pattern 32, is restricted from entering into the insulating layer 34.

In this manner, deterioration of insulation of the insulating layer 34 is restricted, and accordingly, the shield electrode 38 and the connection pattern 32 are not electrically connected to each other.

Thus, even though a pair of layers having a property of conducting electricity are formed by printing inks and an insulating layer is formed between the pair of layers, insulation between the electrically conductive layers sandwiching the insulating layer is maintained (i.e., the electrically conductive layers are not electrically connected to each other). Therefore, the number of componential members can be reduced (since any optional insulating sheet and the like is not required to form an insulating layer). Accordingly, costs for the switch panel device 10 including plural conductive layers can be reduced.

In other words, the first and second conductive layers are formed by coating a solvent-type substance, and the insulating layer is formed by coating a curing-acceleration-type substance. In this manner, first and second insulations are maintained. Accordingly, a panel device including layered plural conductive layers can be formed with costs reduced.

In addition, at each time after a printing step of forming one of respective layers is performed, a printed layer is sufficiently dried. Therefore, deterioration of insulation of the insulating layer 34 is much more restricted.

The switch 40 is configured to include the touch sensing electrode 41 and besides an electrostatic capacitive sensor. Since the touch sensing electrode 41 can be formed by printing, shape-forming of the panel body 30 is not restricted by the touch sensing electrode 41.

Therefore, the panel body 30 has an improved degree of freedom in shape. Further, the switch 40 has a structure using no mechanical contact points and the like, and accordingly, the number of componental parts can be reduced. Therefore, costs for the switch panel device 10 can be reduced.

The present embodiment has been described referring to the shield electrode 38 and the connection pattern 32 as examples of conductive layers having a property of conducting electricity, as well as referring to the insulating layer 34 an example of an insulating layer sandwiched between the electrode and the pattern to prevent the conductive layers from being electrically connected to each other.

However, examples are not limited hitherto. For example, if electrically conductive substance is contained in the ink 36a forming the design layer 36, the design layer 36 is then a conductive layer, and therefore, an insulating layer is also formed between the design layer 36 and the shield electrode 38 so as not to electrically connect the design layer 36 and the shield electrode 38 to each other.

In this case, the ink 36a forming the design layer 36 is a solvent-type ink. The insulating layer 34 to be sandwiched in between may be formed of the same as the ink 34a forming the insulating layer 34.

As a result of this, deterioration of insulation of the insulating layer formed between the design layer 36 and the shield electrode 38 is restricted. Therefore, the design layer 36 and the shield electrode 38 are prevented from being electrically connected to each other.

In the present embodiment, the switch panel device 10 includes a pair of electrically conductive layers (the shield electrode 38 and connection pattern 32) having a property of conducting electricity. The present embodiment is not limited hitherto. Three or more electrically conductive layers may be included. In this case, an insulating layer is provided between every neighboring conductive layers. Since these conductive and insulating layers are formed in the same manner as described above, the same effects as described above can be achieved even if plural conductive layers are layered.

Next, a panel device according to the second embodiment of the present invention will be described with reference to FIGS. 5 to 8. Structures that have the same functions as in the first embodiment will be denoted at the same reference symbols as in the first embodiment, and descriptions thereof will be omitted herefrom. In the present embodiment, inks forming a shield electrode 38 and an insulating layer 34 differ from those in the first embodiment. The other structures may be the same as in the first embodiment. Hence, the difference described above will be described referring again to FIGS. 5 to 8 which have been referred to in the first embodiment.

FIGS. 5 to 8 are cross-sectional views illustrating states of forming respective layers of a switch panel device 10 according to the present embodiment.

FIG. 5 illustrates a state where a design layer 36 is formed on a panel section 31 by screen printing, and a state where a touch sensing electrode 41 is also formed by screen printing. As illustrated in FIG. 5, an ink 36a is used for a design layer 36, as in the first embodiment. An ink 41a is used for the touch sensing electrode 41, as in the first embodiment, too.

FIG. 6 illustrates a state where a shield electrode 38 is formed on the design layer 36 by screen printing. As illustrated in FIG. 6, an ink 38c in place of an ink 38a is used for the shield electrode 38 in the present embodiment. The ink 38c is a curing-acceleration-type ink having a property of conducting electricity. For example, the ink 38c is of an ultraviolet curing agent type or a two-liquid reaction type (as described in the first embodiment) and has a property of conducting electricity.

FIG. 7 illustrates a state where an insulating layer 34 is formed on the shield electrode 38 by screen printing. As illustrated in FIG. 7, an ink 34c in place of an ink 34a is used for the insulating device 34 in the present embodiment. The ink 34c is an insulating solvent-type ink (as described in the first embodiment).

FIG. 8 illustrates a state where a connection pattern 32 is formed on the insulating layer 34 by screen printing. A solvent-type ink having a property of conducting electricity is used for the connection pattern 32, as in the first embodiment, and therefore, an ink 32a is used.

The ink 38c is a curing-acceleration-type ink as described in the first embodiment, as described above, and is insulating. The ink 38c is an example of what is referred to as a curing-acceleration-type substance in the present invention.

The ink 34c is a solvent-type ink as has been described in the first embodiment, and is insulating. The ink 34c is an example of a substance of what is referred to as an insulating solvent type in the present invention.

Also in the present embodiment, the inks each are sufficiently dried after printing. The present embodiment is also capable of obtaining the same effects as the first embodiment.

In the present embodiment, the shield electrode 38 as a first conductive layer is formed of the ink 38c (an example of a curing-acceleration-type substance) of the curing acceleration type having a property of conducting electricity. The connection pattern 32 as a second conductive layer is formed of the ink 32a (an example of a solvent-type substance) of the solvent type having a property of conducting electricity.

However, if the shield electrode 38 is formed of the ink 38a of a solvent type having a property of conducting electricity as used in the first embodiment, and if the connection pattern 32 is formed of an ink 32c of a curing acceleration type having a property of conducting electricity as illustrated in FIG. 8, the same effects can be obtained.

Next, a panel device according to the third embodiment of the present invention will be described with reference to FIGS. 5 to 8. Structures that have the same functions as in the first embodiment will be denoted at the same reference symbols as in the first embodiment, and descriptions thereof will be omitted herefrom. In the present embodiment, inks forming a shield electrode 38, an insulating layer 34, an earth electrode 32, and a touch sensing electrode 41 differ from those in the first embodiment. The other structures may be the same as in the first embodiment. Hence, the difference described above will be described referring again to FIGS. 5 to 8 which have been referred to in the first embodiment.

FIGS. 5 to 8 are cross-sectional views illustrating states of forming respective layers of a switch panel device 10 according to the present embodiment.

FIG. 5 illustrates a state where a design layer 36 is formed on a panel section 31 by screen printing, and a state where a touch sensing electrode 41 is also formed by screen printing. As illustrated in FIG. 5, an ink 36a is used for a design layer 36, as in the first embodiment.

An ink 41b in place of an ink 41a is used for the touch sensing electrode 41. The ink 41b is a curing-acceleration-type ink having a property of conducting electricity. For example, the ink 41b is of an ultraviolet curing agent type or a two-liquid reaction type (as described in the first embodiment) and has a property of conducting electricity.

FIG. 6 illustrates a state where a shield electrode 38 is formed on a design layer 36 by screen printing. As illustrated in FIG. 6, an ink 38b in place of an ink 38a is used for the shield electrode 38 in the present embodiment. The ink 38b is of a curing acceleration type having the property of conducting electricity. For example, the ink 38b is of an ultraviolet curing agent type or a two-liquid reaction type (as described in the first embodiment) and has a property of conducting electricity.

FIG. 7 illustrates a state where an insulating layer 34 is formed on the shield electrode 38 by screen printing. As illustrated in FIG. 7, an ink 34b in place of an ink 34a is used for the insulating device 34 in the present embodiment. The ink 34b is of an insulating solvent type.

FIG. 8 illustrates a state where a connection pattern 32 is formed on the insulating layer 34 by screen printing. As illustrated in FIG. 8, an ink 32b in place of an ink 32a is used for the connection pattern 32. The ink 32b is a curing-acceleration-type ink having a property of conducting electricity. For example, the ink 32b is of an ultraviolet curing agent type or a two-liquid reaction type (as described in the first embodiment) and has a property of conducting electricity.

As described above, the inks 32b, 38b, and 41b are of a curing acceleration type as described in the first embodiment, and have a property of conducting electricity. The inks 32b, 38b, and 41b are examples of what is referred to as a curing-acceleration-type substance having a property of conducting electricity.

The ink 34b is a solvent-type ink as described in the first embodiment, and has a property of insulating electricity. The ink 34b is an example of what is referred to as an insulating solvent-type substance.

Also in the present embodiment, the inks each are sufficiently dried after printing. The present embodiment is also capable of obtaining the same effects as the first embodiment.

In the present embodiment, the touch sensing electrode 41 is formed by using the ink 41b which may be replaced with an ink 41a described in the first embodiment. In brief, the connection pattern 32 and the touch sensing electrode 41 need only to be connected to each other.

The present invention is not exactly limited to the embodiments described above but can be embodied with componential elements modified in a practical phase within a scope of not deviating from the subject matter of the invention. Further, various invention can be derived from appropriate combinations of plural componential elements disclosed in the embodiments described above. For example, several componential elements may be removed from the whole componential elements suggested in the above embodiments. Further, componential elements may be appropriately combined between different embodiments.

The present invention can provide a switch panel device capable of layering plural conductive layers with costs reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A panel device comprising:
   a panel section;
   a touch sensing electrode provided directly on a surface in an area of the panel section;
   a shield electrode provided in a side of the surface of the panel section except for the area without making electrical contact with the touch sensing electrode, and formed by coating an electrically conductive substance containing solvent;
   a design layer provided between the surface of the panel section and the shield electrode;
   an insulating layer that is stacked on the shield electrode except for the area and is formed by coating an insulating substance containing curing agent that accelerates curing; and
   a connection pattern, formed by coating an electrically conductive substance containing solvent, and stacked on the insulating layer except for the area, the connection pattern having a portion extending towards the touch sensing electrode and making electrical contact with the touch sensing electrode without making electrical contact with the shield electrode,
   wherein the shield electrode, the design layer, and the insulating layer define an aperture surrounding the area, and the touch sensing electrode is exposed through the aperture.

2. A panel device comprising:
   a panel section;
   a touch sensing electrode provided directly on a surface in an area of the panel section;
   a shield electrode provided in a side of the surface of the panel section except for the area without making electrical contact with the touch sensing electrode, and formed by coating an electrically conductive substance containing curing agent that accelerates curing;
   a design layer provided between the surface of the panel section and the shield electrode;
   an insulating layer that is stacked on the shield electrode except for the area and is formed by coating an insulating substance containing solvent; and
   a connection pattern, formed by coating an electrically conductive substance containing solvent, and stacked on the insulating layer except for the area, the connection pattern having a portion extending towards the touch sensing electrode and making electrical contact with the touch sensing electrode without making electrical contact with the shield electrode,
   wherein the shield electrode, the design layer, and the insulating layer define an aperture surrounding the area, and the touch sensing electrode is exposed through the aperture.

3. A panel device comprising:
a panel section;
a touch sensing electrode provided directly on a surface in an area of the panel section;
a shield electrode provided in a side of the surface of the panel section except for the area without making electrical contact with the touch sensing electrode, and formed by coating an electrically conductive substance containing curing agent that accelerates curing;
a design layer provided between the surface of the panel section and the shield electrode;
an insulating layer that is stacked on the shield electrode except for the area and is formed by coating an insulating substance containing solvent; and
a connection pattern, formed by coating an electrically conductive substance containing curing agent that accelerates curing, and stacked on the insulating layer except for the area, the connection pattern having a portion extending towards the touch sensing electrode and making electrical contact with the touch sensing electrode without making electrical contact with the shield electrode,
wherein the shield electrode, the design layer, and the insulating layer define an aperture surrounding the area, and the touch sensing electrode is exposed through the aperture.

\* \* \* \* \*